United States Patent
Chao (10) Patent No.: US 7,576,435 B2
(45) Date of Patent: Aug. 18, 2009

(54) LOW-COST AND ULTRA-FINE INTEGRATED CIRCUIT PACKAGING TECHNIQUE

(75) Inventor: Clinton Chao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 116 days.

(21) Appl. No.: 11/796,297

(22) Filed: Apr. 27, 2007

(65) Prior Publication Data

US 2008/0265399 A1    Oct. 30, 2008

(51) Int. Cl.
    *H01L 23/48* (2006.01)
(52) U.S. Cl. .................. 257/778; 257/774
(58) Field of Classification Search .......... 257/774, 257/778, 678
    See application file for complete search history.

(56) References Cited

U.S. PATENT DOCUMENTS

| 5,202,754 | A   |   | 4/1993  | Bertin et al.           |
|-----------|-----|---|---------|-------------------------|
| 5,477,933 | A   | * | 12/1995 | Nguyen ........... 174/262 |
| 6,548,391 | B1  |   | 4/2003  | Ramm et al.             |
| 6,914,786 | B1  | * | 7/2005  | Paulsen et al. ... 361/790 |

* cited by examiner

*Primary Examiner*—Roy K Potter
(74) *Attorney, Agent, or Firm*—Slater & Matsil, L.L.P.

(57) ABSTRACT

A semiconductor package structure and the methods for forming the same are provided. The semiconductor package structure includes an interposer; a first plurality of bonding pads on a side of the interposer; a semiconductor chip; and a second plurality of bonding pads on a side of the semiconductor chip. The first and the second plurality of bonding pads are bonded through metal-to-metal bonds.

20 Claims, 9 Drawing Sheets

LOW-COST AND ULTRA-FINE INTEGRATED CIRCUIT PACKAGING TECHNIQUE

TECHNICAL FIELD

This invention relates generally to integrated circuit manufacturing processes, and more particularly to electronic packaging processes, and even more particularly to the bonding of dies onto interposers.

BACKGROUND

Interposers are used for integrated circuit packaging, typically for space transformation, which is for routing connections between semiconductor dies and packaging components. For example, semiconductor dies may have tightly-spaced bonding pads, which are inconvenient for being packaged onto package substrates. Interposers may thus be used to increase the pitches of the semiconductor dies. In this case, an interposer has a side with a first pitch, which corresponds to the pitches of the respective semiconductor dies bonded thereon. Bonding pads on the other side have a second pitch greater than the first pitch, and the second side may be bonded onto a package substrate.

Figure 1:
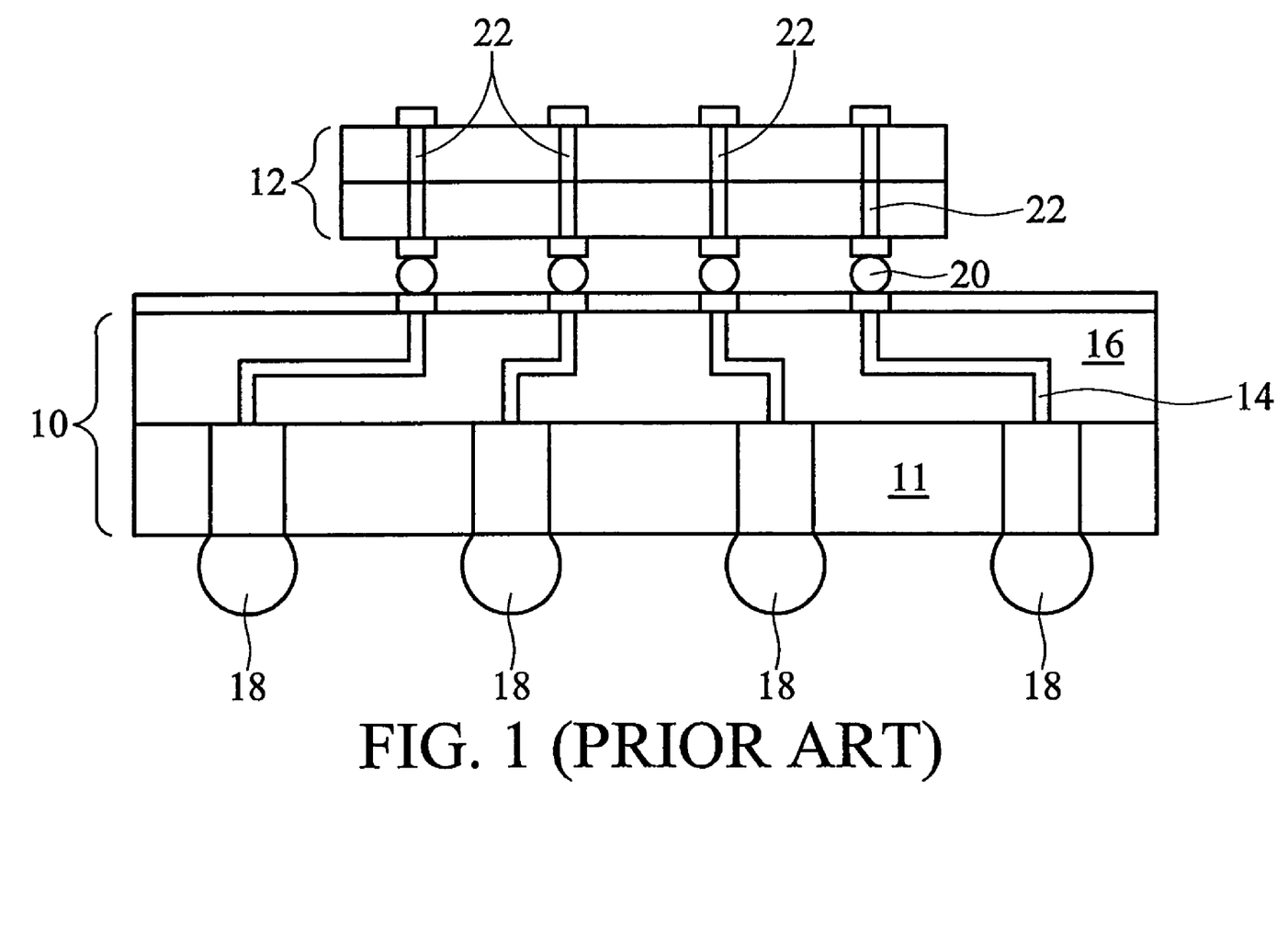
FIG. 1 illustrates a die bonded onto an interposer through solder bumps.

FIG. 1 illustrates a conventional package including interposer 10, and die 12 bonded onto interposer 10. Usually, interposer 10 includes substrate 11, which is typically formed of organic materials or ceramics. Metal connections 14 are formed in dielectric layers 16. Through the routing in dielectric layers 16, metal connections 14 transform a greater pitch of solder bumps 18 into a smaller pitch of solder bumps 20. Die 12 may further include through-silicon vias (TSV) 22 for making an electrical connection from solder bumps 20 to the opposite side of die 12. Die 12 is flip-chip bonded onto interposer through solder bumps 20.

With the increasing down-scaling of integrated circuits, it is preferred that the pitch of bumps 20 is as small as the pitch of bonding pads on semiconductor die 12. Existing formation technology has scaled the pitch of TSVs 22 to about 20 μm. However, a bottleneck exists for downscaling the pitch of solder bumps 20. Currently, for bonds made through solder bumps 20, the minimum achievable pitch is only about 130 μm, which is significantly greater than the pitch of TSVs 22. As a result, the capability of through-silicon via technology is not fully utilized. A new bonding technique is thus needed.

SUMMARY OF THE INVENTION

In accordance with one aspect of the present invention, a semiconductor package structure and the methods for forming the same are provided. The semiconductor package structure includes an interposer; a first plurality of bonding pads on a side of the interposer; a semiconductor chip; and a second plurality of bonding pads on a side of the semiconductor chip. The first and the second plurality of bonding pads are bonded through metal-to-metal bonds.

In accordance with another aspect of the present invention, a semiconductor package structure includes an interposer; a first plurality of bonding pads on a side of the interposer; a semiconductor chip; and a second plurality of bonding pads on a side of the semiconductor chip. The bonds between the first and the second plurality of bonding pads are free from solder bumps.

In accordance with yet another aspect of the present invention, a semiconductor package structure includes an interposer, which comprises a silicon-containing substrate; a plurality of through-silicon vias in the silicon-containing substrate; a first plurality of bonding pads connected to the plurality of through-silicon vias, wherein the first plurality of bonding pads are on a first side of the interposer, and wherein the first plurality of the bonding pads has a first pitch; and a second plurality of bonding pads on a second side of the interposer opposite to the first side. The second plurality of bonding pads has a second pitch less than the first pitch. The semiconductor package structure further includes a semiconductor chip including a third plurality of bonding pads bonded to the second plurality of bonding pads, wherein the second and the third plurality of bonding pads are bonded through metal-to-metal bonds.

In accordance with yet another aspect of the present invention, a method of forming a semiconductor package structure includes providing an interposer; forming a first plurality of bonding pads on a side of the interposer; providing a semiconductor chip; forming a second plurality of bonding pads on a side of the semiconductor chip; and bonding the first and the second plurality of bonding pads using metal-to-metal bonding.

In accordance with yet another aspect of the present invention, a method of forming a semiconductor package structure includes forming an interposer, which includes providing a silicon-containing substrate; forming through-silicon vias in the silicon-containing substrate; forming metal traces over the silicon-containing substrate, wherein the metal traces are connected to the through-silicon vias; and forming a first plurality of bonding pads connected to the metal traces. The method further includes providing a semiconductor chip; forming a second plurality of bonding pads on the semiconductor chip; and bonding the first and the second plurality of bonding pads. The bonds between the first and the second plurality of bonding pads are free from solder bumps.

The advantageous features of the present invention include reduced pitch of the bonds between semiconductor dice and interposers, and reduced stresses on semiconductor dice, and the improved feasibility of forming stress-sensitive devices and components within the dice due to the using of silicon-containing interposers.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2 through 7B are cross-sectional views of intermediate stages in the manufacturing of embodiments of the present invention, wherein an interposer and a die are bonded through metal-to-metal bonds.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for forming a semiconductor package structure having ultra-fine pitches is provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 2:
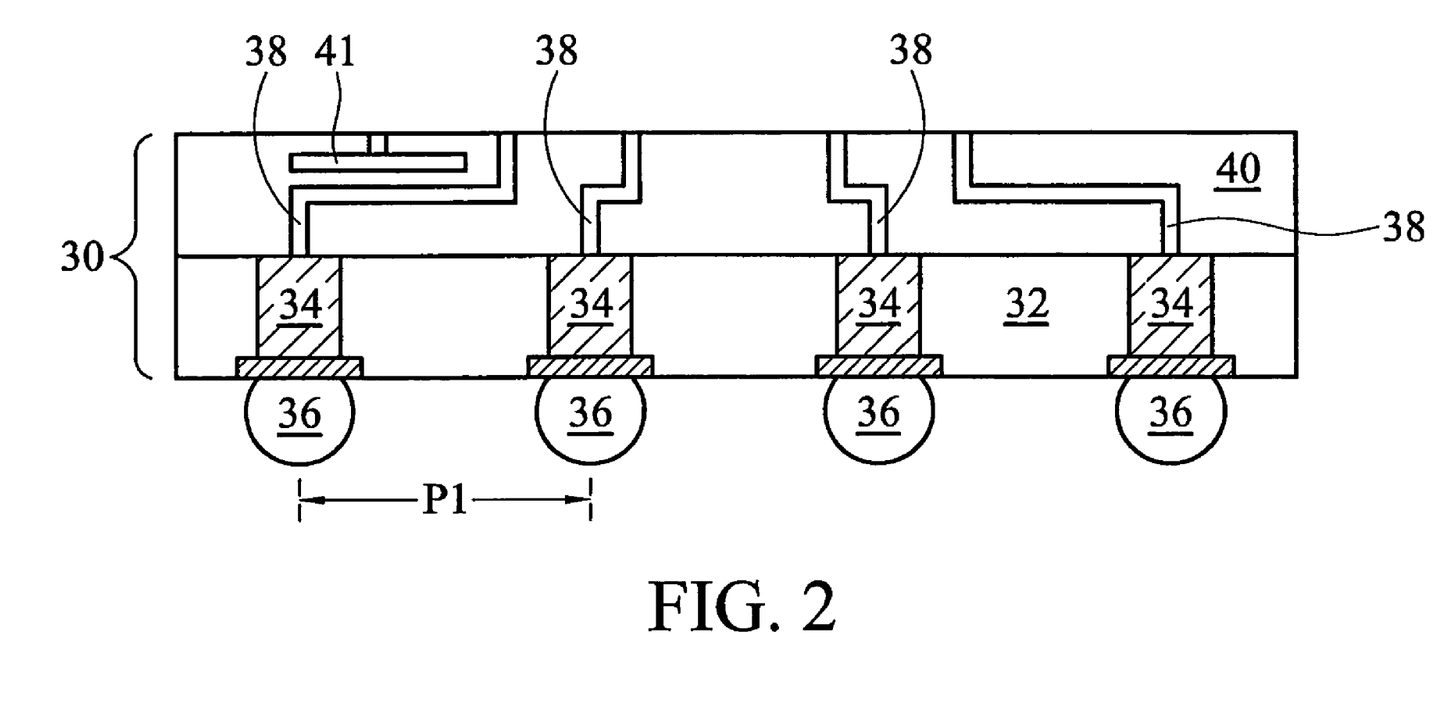

Referring to FIG. 2, interposer 30 is provided. In the preferred embodiment, interposer 30 is a silicon-containing interposer including a silicon-containing substrate 32. Preferably, silicon-containing substrate 32 has a thickness of less than about 750 μm, and more preferably, less than about 150 μm. In alternative embodiments, substrate 32 contains commonly used materials such as inorganic and organic materials, ceramics, and multi-layers thereof. Advantageously, semiconductor chips (also referred to as dice in the art) designated to be bonded on interposer 30 are typically formed on silicon substrates. The coefficient of thermal expansion(s) (CTE) of silicon-containing interposer 30 and the semiconductor chips will have small differences, and thus the undesirable stress generated due to CTE mismatch will be significantly reduced. Furthermore, the formation of silicon-containing interposer 30 can adopt existing silicon processing techniques, which are mature not only regarding reliability, but also the capability of high-volume production.

Interposer 30 includes through-silicon vias (TSV) 34, also alternatively referred to as through-wafer vias 34. Solder bumps 36 are formed on a surface of interposer 30 and are connected to TSVs 34. Pitch P1 of solder bumps 36 (wherein pitch P1 is also the pitch of TSVs 34) is preferably greater than about 130 μm, although in practical design, pitch P1 may be greater or smaller. The other ends of TSVs 34 are connected to metal traces 38, which include metal lines and connecting vias. Metal traces 38 are formed in dielectric layers 40.

With the use of silicon-containing substrate 32, metal traces 38 may be formed using common methods for forming interconnect structures in integrated circuits. In an embodiment, metal traces 38 are formed of metals such as copper, aluminum, tungsten, titanium, and combinations thereof. The preferred formation steps include depositing a metal layer and etching undesired portions, leaving metal traces 38. Alternatively, metal traces 38 may be formed using well-known damascene processes.

Advantageously, interposer 30 may be easily customized to suit different requirements. In an exemplary embodiment, active or passive device 41 is embedded into interposers, wherein device 41 may include impedance matching lines or plates, capacitors, resistors, and the like.

Figure 3:
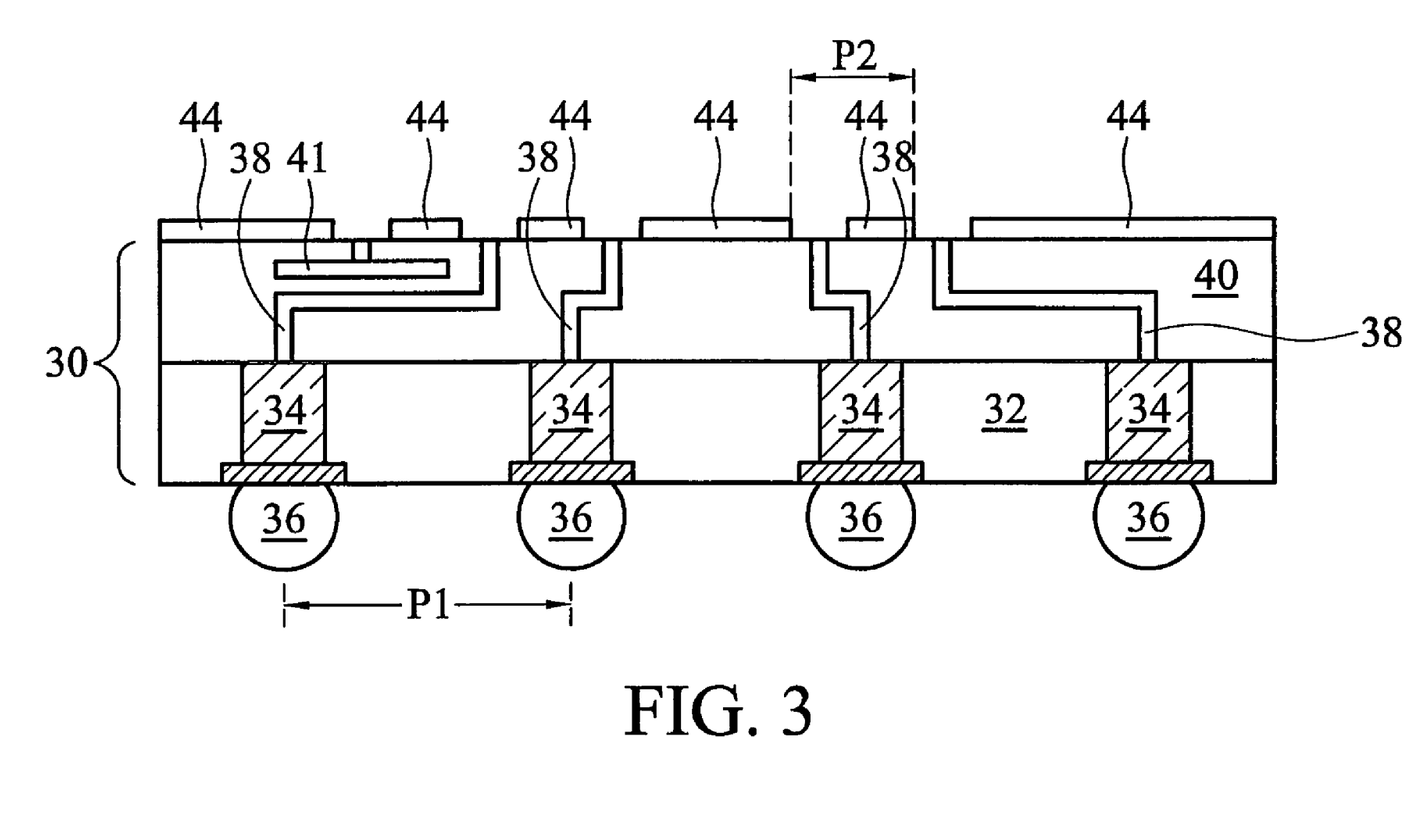

Next, bonding pads 42 are formed. An exemplary embodiment for forming bonding pads 42 is shown in FIGS. 3 through 5B. Referring to FIG. 3, dielectric layer 44 is formed. Dielectric layer 44 may be a passivation layer comprising dense dielectric materials such as oxide or silicon nitride. Openings 46 are formed in dielectric layer 44, exposing underlying metal traces 38. Pitch P2 of openings 46 is preferably less than pitch P1 of solder bumps 36. In an exemplary embodiment, pitch P2 is less than about 130 μm. In other embodiments, pitch P2 is less than about 100 μm. In yet other embodiments, pitch P2 is about 50 μm or less.

Figure 4:
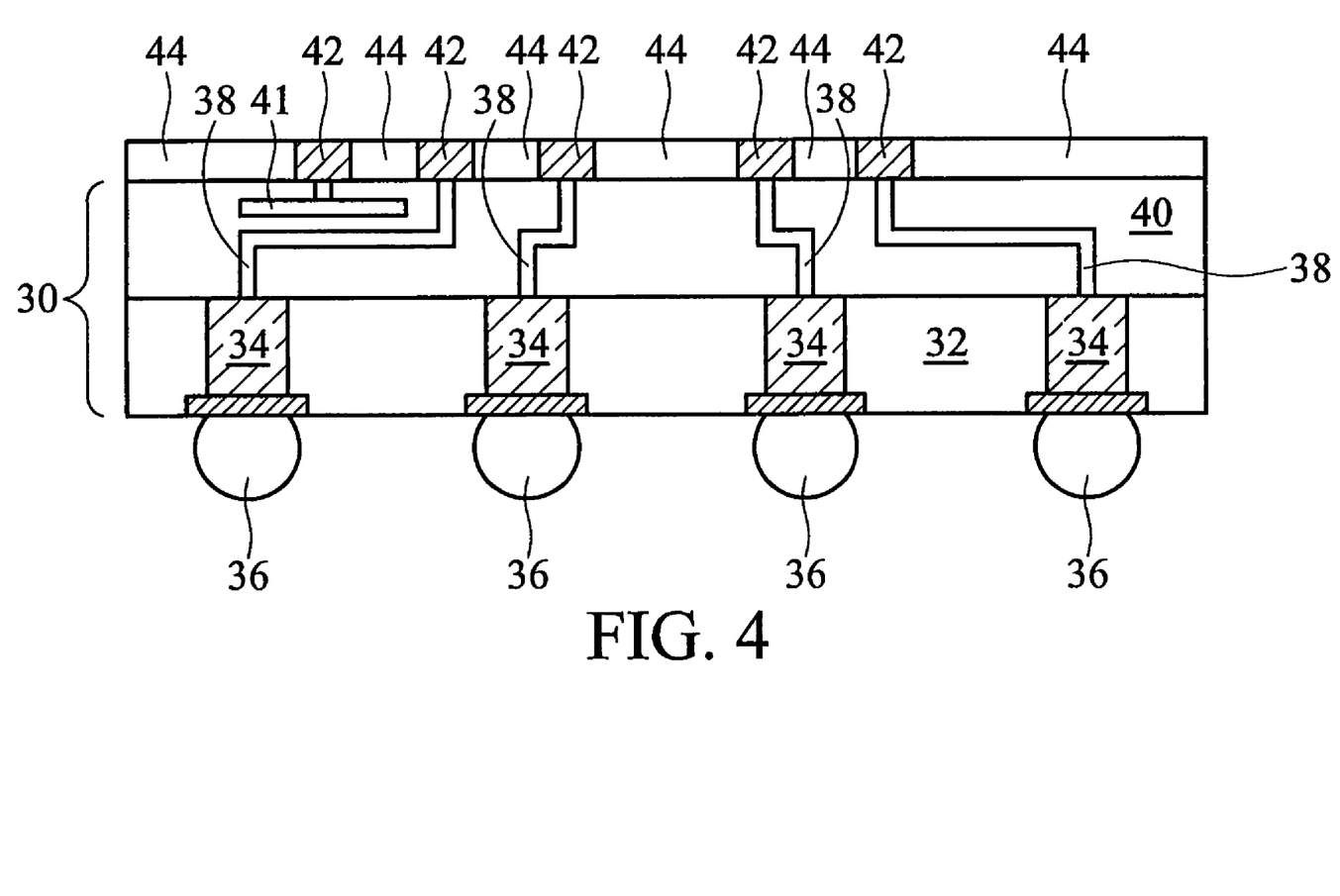
Figure 5A:
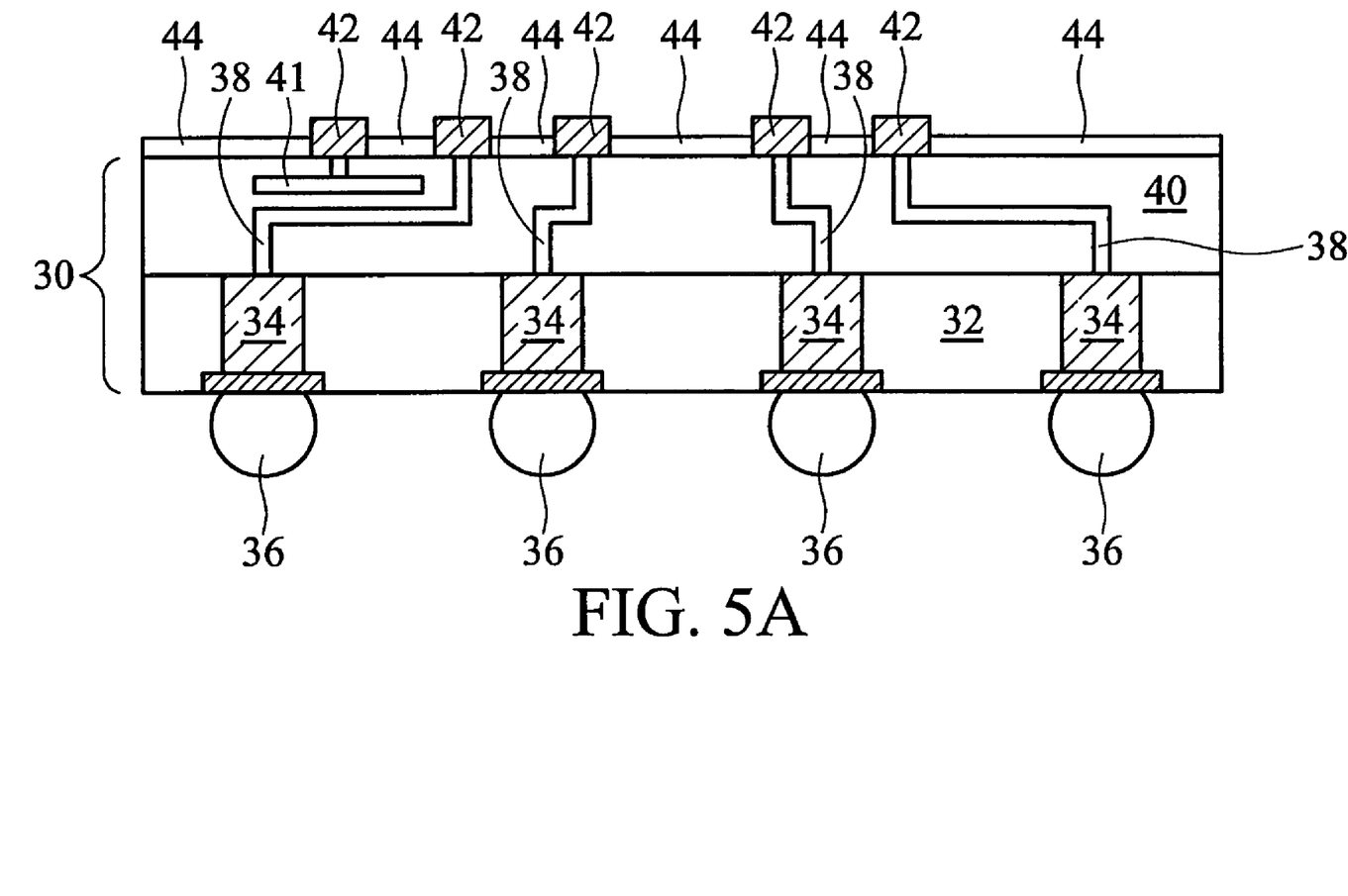

FIG. 4 illustrates the formation of bonding pads 42. First, a metallic material is filled into openings 46 as shown in FIG. 3, for example, by plating. A diffusion barrier layer and/or an adhesion layer (not shown), which may include titanium, tungsten, tantalum, and nitrides thereof, may be formed if needed. In the preferred embodiment, the metallic material includes copper or copper alloys. In other embodiments, aluminum and tungsten may be used. A chemical mechanical polish (CMP) may then be performed to remove excess metallic materials, leaving bonding pads 42. An etch-back is then performed to recess the surface of dielectric layer 44, so that bonding pads 42 extend above dielectric layer 44, as shown in FIG. 5A.

Figure 5B:
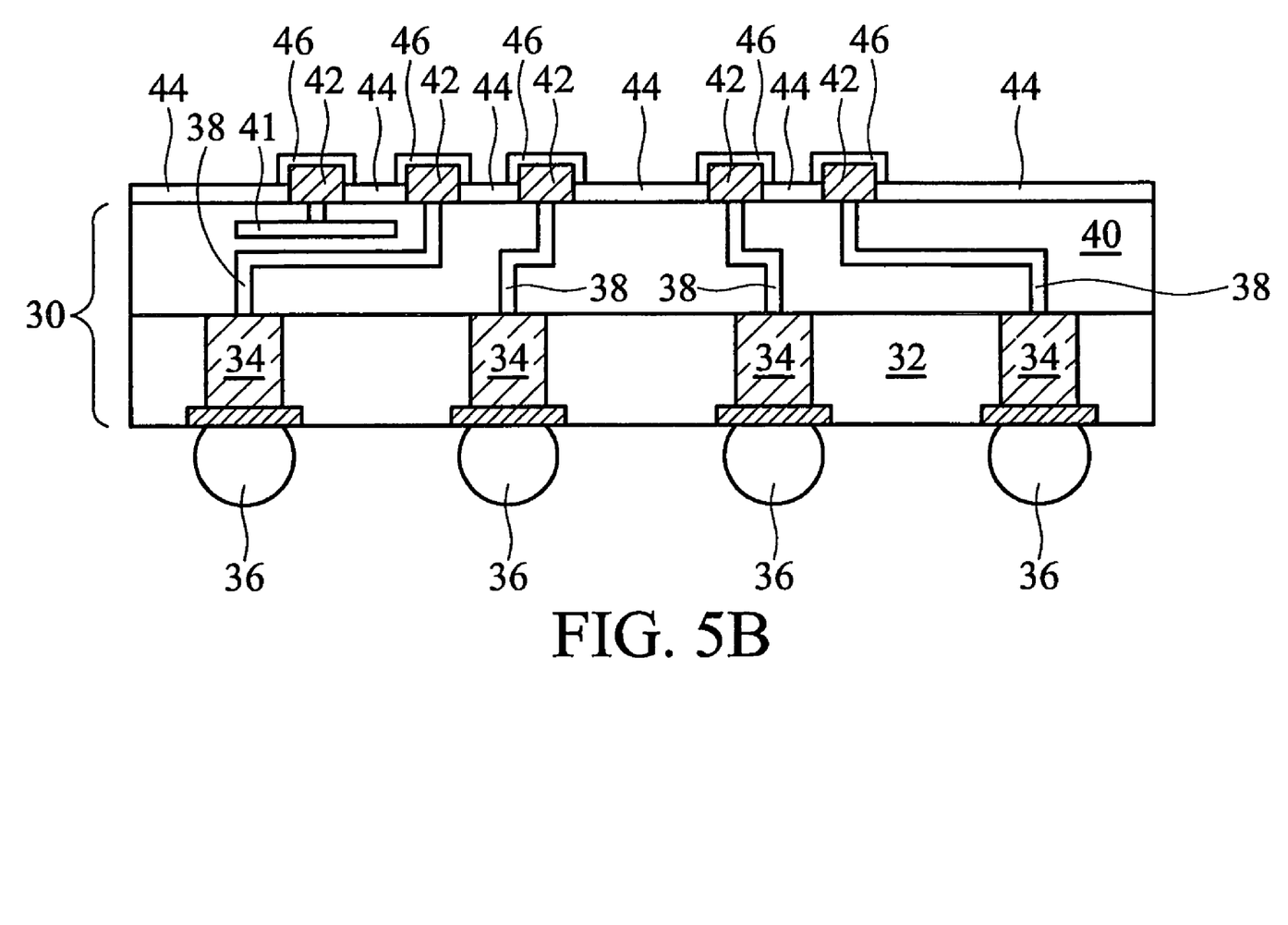

Optionally, as shown in FIG. 5B, interfacial bonding layer 46 is formed on the exposed surface of bonding pads 42. In an exemplary embodiment, interfacial bonding layer 46 includes elemental metals such as tin, gold, alloys thereof. In other embodiments, interfacial bonding layer 46 includes such alloys containing indium, tin, gold, copper, bismuth, and combinations thereof. The thickness of interfacial bonding layer 46 is preferably less than about 5 μm. The formation methods include commonly used deposition methods such as chemical vapor deposition, physical vapor deposition, sputtering, plasma enhanced vapor deposition, plating, and or other transfer techniques involving vacuum, plasma, electrochemical, mechanical, thermal and optically assisted methods. In the preferred embodiment, interfacial bonding layer 46 is conformal to the exposed surface of bonding pads 42, so that a substantially uniform film is formed. In other embodiments, interfacial bonding layer 46 is not conformal, and may have spherical and semi-spherical shapes.

Figure 6A:
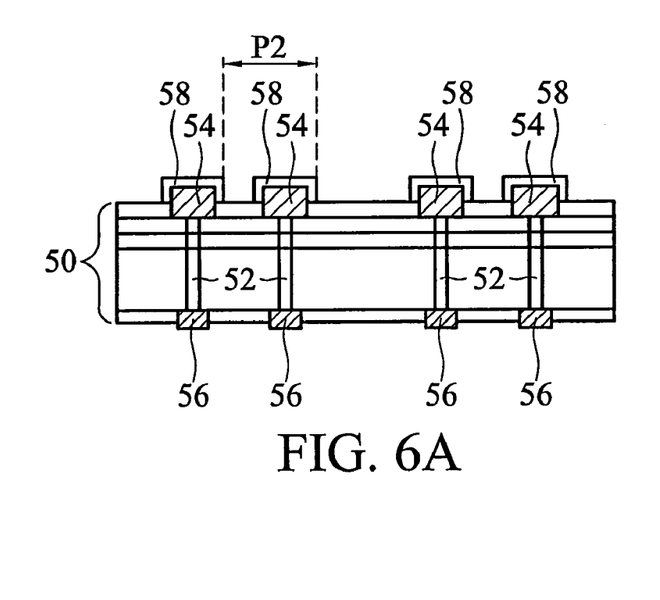
Figure 6B:
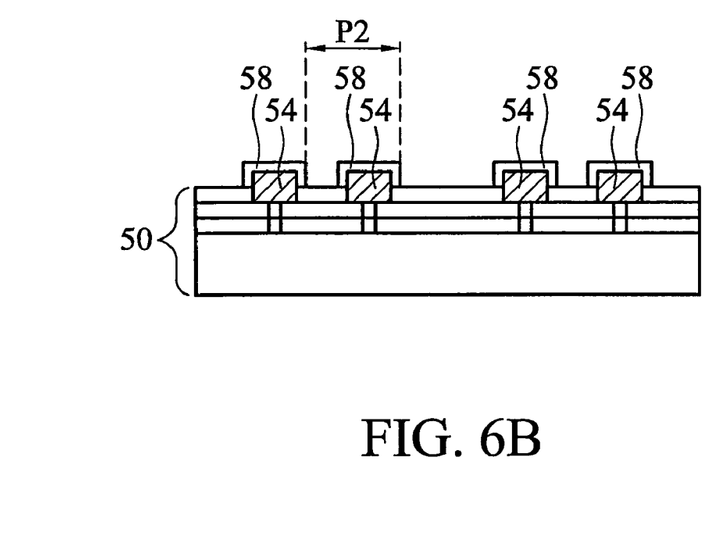

FIG. 6A illustrates semiconductor chip 50, which is to be bonded onto interposer 30. Semiconductor chip 50 preferably includes integrated circuits (not shown). TSVs 52 are formed in the substrate of semiconductor chip 50. The pitch of TSVs 52 is smaller than the pitch of TSVs 34 in interposer 30. Bonding pads 54 and 56 are formed on opposite surfaces of semiconductor chip 50. In alternative embodiments, as is shown in FIG. 6B, only bonding pads 54 are formed, and TSVs are omitted.

Bonding pads 54 may include essentially the same materials as bonding pads 42, and may be formed using essentially the same methods. The pitch P2 of bonding pads 54 is the same as the pitch of bonding pads 42 (refer to FIGS. 3 and 4). Interfacial bonding layer 58, which includes essentially the same materials as interfacial bonding layer 46, may optionally be formed on bonding pads 54.

Prior to the bonding process, an oxide removal process is performed to bonding pads 42 and 56 or corresponding interfacial bonding layers 46 and 58 (refer to FIGS. 5A through 6B) to remove native metal oxide layers. The oxide removal may be performed using commonly used methods such as plasma or sputter etching. Alternatively, thermal processes such as thermal compression in a reducing atmosphere may be used. The reduction of the native metal oxide layers may be achieved by an increase in pressure and temperature. For example, copper-copper bonding may be performed with about 20 pound-per-square-inch (psi) to about 50 psi contact pressure and a temperature of about 300° C. to about 400° C.

Figure 7A:
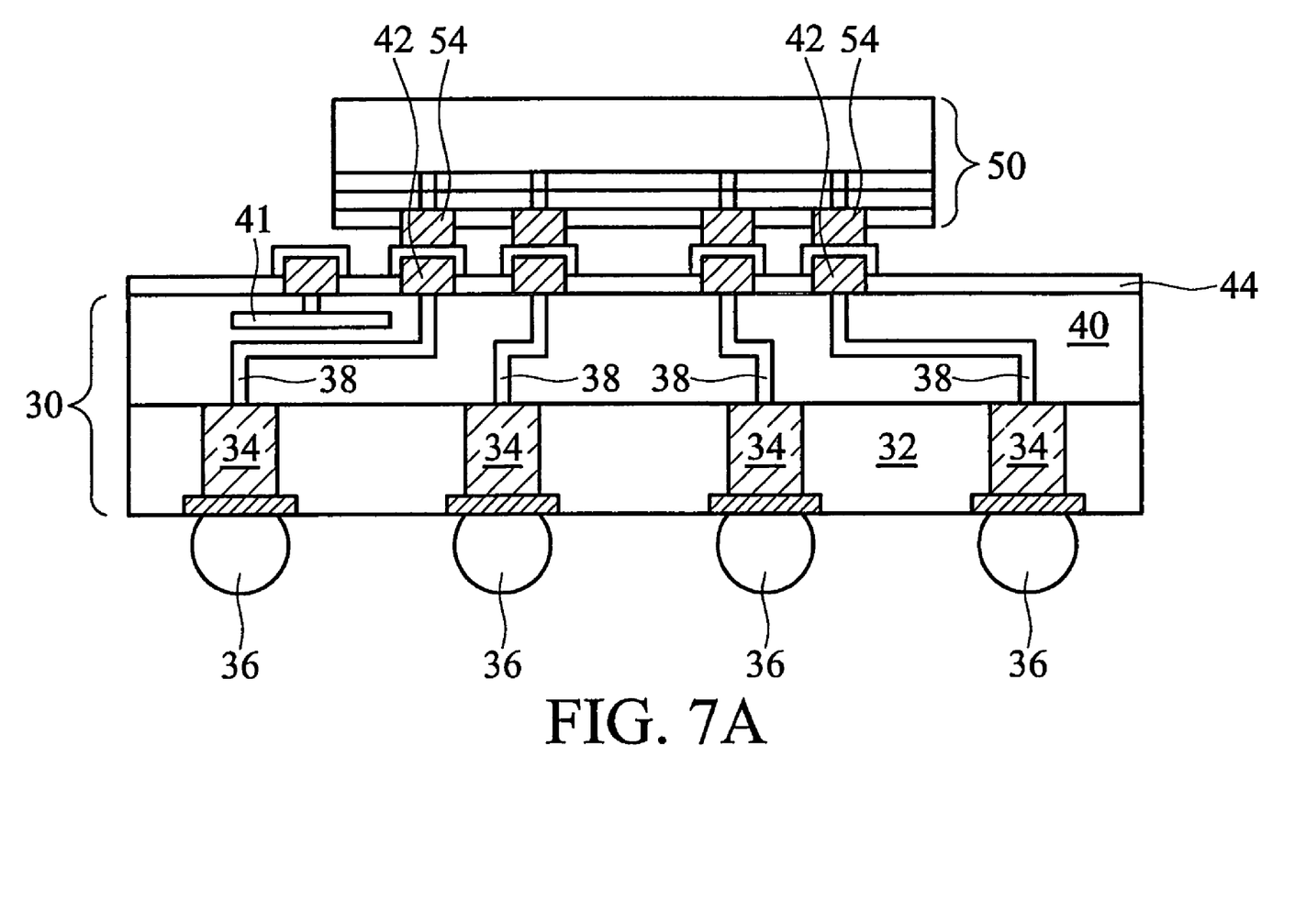

Referring to FIG. 7A, semiconductor chip 50 is bonded onto interposer 30, with bonding pads 42 bonded to bonding pads 54 using direct metal-to-metal bonding. In an exemplary metal-to-metal bonding process, a high pressure, for example, between about 10 psi and about 100 psi, is applied. The bonding temperature is preferably between about 300° C. and about 500° C., which may be provided by infrared or resistive heating. The bonding process may also be performed in a thermal-ultrasonic environment by a thermo-sonic process. It is realized that the required pressures and temperatures are related to the materials of bonding pads 42 and 54, or corresponding interfacial bonding layers 46 and 58. Advantageously, tin, gold, or solder materials in interfacial bonding layers 46 and 58 may cause a decrease in the required bonding pressures and/or bonding temperatures. For example, a CuSn eutectic interfacial bonding layer only requires about 227° C. for the bonding process, while a gold cold weld can be performed at room temperatures with a gold-containing interfacial bonding layer 46 and/or 58.

The bonding temperature is lower than the liquid's temperatures or melting temperatures of bonding pads 42 and 56, but can be either higher (so that the interfacial bonding layer is reflowed), or lower than a melting temperature of interfacial bonding layers 46 and 58. In the case the interfacial bonding layer 46 and/or 58 is reflowed during the bonding process, with a pressure mildly applied, the melted interfacial bonding materials may not be squeezed appreciably sideway, and bonding pads 42 may be bonded to bonding pads 54, with a thin layer of alloy resulting from the alloy interfacial materials therebetween. The interfacial bonding layers 46 and/or 58 may need to be very thin layers, for example, less than 1 μm in thickness after bonding.

Figure 7B:
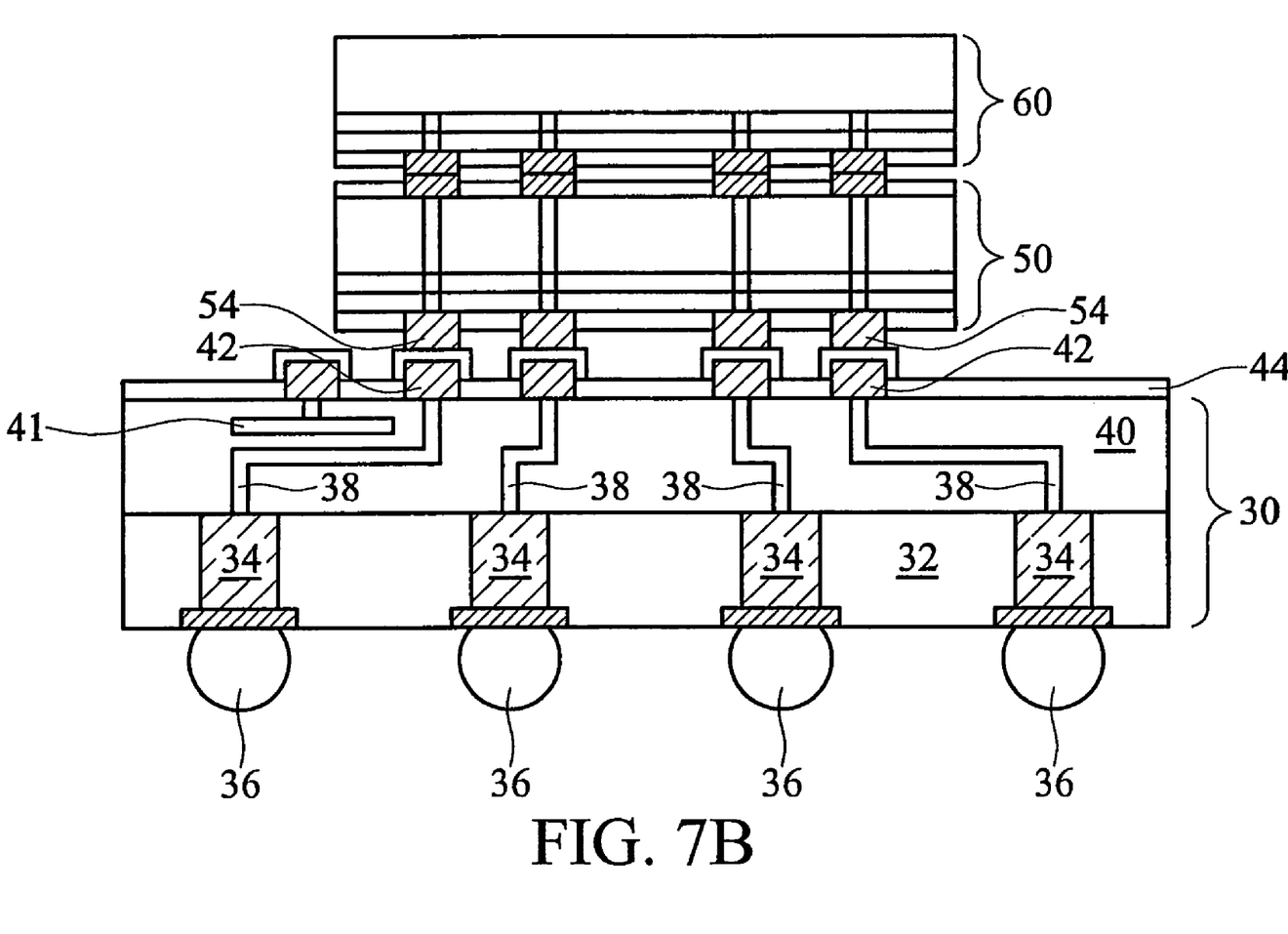

FIG. 7B illustrates the stacking of semiconductor chips 50 and 60 onto interposer 30. In the preferred embodiment, semiconductor chips 50 and 60 are bonded together before they are bonded onto interposer 30. Alternatively, semiconductor chip 50 is bonded onto interposer 30 first, and then semiconductor chip 60 is bonded onto semiconductor chip 50. One skilled in the art will realize the corresponding bonding process steps. More dies can be bonded onto semiconductor chip 60 if needed.

Although in the illustrated exemplary embodiment, semiconductor chips 50 and 60 are bonded back-to-face, one skilled in the art will realize a face-to-face bonding may be used.

The embodiments of the present invention have several advantageous features. The bonding between semiconductor chips and interposers is metal-to-metal bonding, which results in a significant reduction in the pitches of bonding pads as compared to the pitches of bonding using solder bumps, which is limited to not much smaller than 50 μm. The pitches of the embodiments of the present invention may be reduced to about 5 μm or less. Additionally, silicon-containing interposers are used, and hence interposers have the same CTE as the semiconductor chips bonded thereon. The stresses caused by thermal expansion are thus reduced, and possibly substantially eliminated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skills in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package structure comprising:
an interposer;
a first plurality of bonding pads on a side of the interposer;
a semiconductor chip; and
a second plurality of bonding pads on a side of the semiconductor chip, wherein the first and the second plurality of bonding pads are bonded through metal-to-metal bonds.

2. The semiconductor package structure of claim 1, wherein the interposer comprises silicon.

3. The semiconductor package structure of claim 1, wherein the interposer comprises a plurality of through-silicon vias.

4. The semiconductor package structure of claim 3, wherein the first plurality of bonding pads has a first pitch, and wherein the through-silicon vias have a second pitch greater than the first pitch.

5. The semiconductor package structure of claim 1, wherein the first pitch is less than about 130 μm.

6. The semiconductor package structure of claim 1, wherein each of the first and the second plurality of bonding pads comprises a material selected from the group consisting essentially of copper, aluminum, and combinations thereof.

7. The semiconductor package structure of claim 1 further comprising an interfacial bonding layer between each of the first plurality of bonding pads and a respective bonding pad in the second plurality of bonding pads.

8. The semiconductor package structure of claim 7, wherein the interfacial bonding layer has a thickness of less than about 10 μm.

9. The semiconductor package structure of claim 8, wherein the interfacial bonding layer comprises solder.

10. The semiconductor package structure of claim 1 further comprising interfacial bonding materials on sidewalls of the first and the second plurality of bonding pads, wherein each of the first plurality of bonding pads is in physical contact with a respective bonding pad in the second plurality of bonding pads.

11. A semiconductor package structure comprising:
an interposer;
a first plurality of bonding pads on a side of the interposer;
a multi-chip semiconductor structure having at least a first chip and a second chip; and
a second plurality of bonding pads on a side of the first chip, wherein bonds between the first and the second plurality of bonding pads are bonded through metal-to-metal bonds.

12. The semiconductor package structure of claim 11, wherein the first and the second bonding pads have a pitch of less than about 50 μm.

13. The semiconductor package structure of claim 12, wherein the pitch is less than about 5 μm.

14. The semiconductor package structure of claim 11, wherein the first and the second plurality of bonding pads each comprise a material selected from the group consisting essentially of copper, aluminum, and combinations thereof, and wherein the bonds between the first and the second plurality of bonding pads further comprise thin interfacial bonding layers.

15. A semiconductor package structure comprising:
an interposer comprising:
a silicon-containing substrate;
a plurality of through-silicon vias in the silicon-containing substrate;
a first plurality of bonding pads connected to the plurality of through-silicon vias, wherein the first plurality of bonding pads are on a first side of the interposer, and wherein the first plurality of the bonding pads has a first pitch; and
a second plurality of bonding pads on a second side of the interposer opposite to the first side, wherein the second plurality of bonding pads has a second pitch less than the first pitch; and
a semiconductor chip comprising a third plurality of bonding pads bonded to the second plurality of bonding pads, wherein the second and the third plurality of bonding pads are bonded through metal-to-metal bonds.

16. The semiconductor package structure of claim 15, wherein the second and the third plurality of bonding pads are bonded through direct copper-to-copper bonds.

17. The semiconductor package structure of claim 15 further comprising an interfacial bonding layer between each pair of the first and the second plurality of bonding pads, wherein the interfacial bonding layer has a thickness of less then about 1 μm.

18. The semiconductor package structure of claim 15 further comprising an additional semiconductor chip bonded onto the semiconductor chip, wherein the semiconductor chip comprises through-silicon vias.

19. The semiconductor package structure of claim 15, wherein the interposer comprises passive devices formed in dielectric layers overlying the silicon-containing substrate.

20. The semiconductor package structure of claim 19, wherein the interposer further comprises active devices formed in the silicon interposer.

* * * * *